United States Patent
Seshia et al.

(10) Patent No.: US 11,804,791 B2
(45) Date of Patent: Oct. 31, 2023

(54) VIBRATIONAL ENERGY HARVESTER WITH PISTON DAMPING

(71) Applicant: 8POWER LIMITED, Cambridge (GB)

(72) Inventors: Ashwin Seshia, Cambridge (GB); Antony Rix, Cambridge (GB); James Horne, Warrington (GB); Yu Jia, Chester (GB)

(73) Assignee: 8POWER LIMITED, Cambridge (GB)

( * ) Notice: Subject to any disclaimer, the term of this patent is extended or adjusted under 35 U.S.C. 154(b) by 596 days.

(21) Appl. No.: 16/963,124

(22) PCT Filed: Jan. 30, 2019

(86) PCT No.: PCT/GB2019/050265
§ 371 (c)(1),
(2) Date: Jul. 17, 2020

(87) PCT Pub. No.: WO2019/150113
PCT Pub. Date: Aug. 8, 2019

(65) Prior Publication Data
US 2021/0058011 A1 Feb. 25, 2021

(30) Foreign Application Priority Data
Feb. 1, 2018 (GB) ..................... 1801678

(51) Int. Cl.
*H02N 2/18* (2006.01)
*H10N 30/30* (2023.01)
*H02K 7/18* (2006.01)

(52) U.S. Cl.
CPC ........... *H02N 2/186* (2013.01); *H02K 7/1876* (2013.01); *H10N 30/306* (2023.02); *H10N 30/308* (2023.02)

(58) Field of Classification Search
CPC .. H02N 2/186; H01L 41/1136; H01L 41/1138
See application file for complete search history.

(56) References Cited

U.S. PATENT DOCUMENTS 8,970,092 B2 * 3/2015 Formosa ................ H02N 2/186
310/329
9,048,419 B2 6/2015 Xu et al.
(Continued)

FOREIGN PATENT DOCUMENTS

| EP | 2677656 A2 | 12/2013 |
| WO | 2008150536 A2 | 12/2008 |
| WO | 2015036869 A2 | 3/2015 |
| WO | 20190150113 A2 | 8/2019 |

OTHER PUBLICATIONS

Emmanuelle Arroyo, Member, IEEE, Yu Jia, Member, IEEE, Sijun Du, Student Member, IEEE, Shao-Tuan Chen, and Ashwin A. Seshia, Senior Member, IEEE, Experimental and Theoretical Study of a Piezoelectric Vibration Energy Harvester Under High Temperature,Journal of Microelectromechanical Systems, 2017, p. 1-10, IEEE.

(Continued)

*Primary Examiner* — J. San Martin
(74) *Attorney, Agent, or Firm* — Todd A. Serbin; Maynard Nexsen PC

(57) ABSTRACT

There is provided a vibrational energy harvester comprising: a frame, a flexure assembly coupled to the frame, the flexure assembly comprising a flexure configured to flex in a first direction relative to the frame and a mass fixed to the flexure, wherein when the mass is displaced in the first direction from a rest position, the flexure provides a restoring force on the mass to bring the mass back to the rest position, and a transduction assembly configured to convert movement of the mass and flexure into electrical energy, wherein the frame comprises a cavity positioned so that, if the mass is displaced in the first direction beyond a threshold distance, a portion of the flexure assembly extends into the cavity so that compression or restriction of fluid in the cavity applies an additional force on the flexure assembly.

14 Claims, 5 Drawing Sheets

(56) References Cited

U.S. PATENT DOCUMENTS

| | | | |
|---|---|---|---|
| 9,787,220 B2* | 10/2017 | Herder | H02N 2/188 |
| 2007/0145861 A1 | 6/2007 | Tanner | |
| 2009/0085442 A1* | 4/2009 | Kozinsky | H02N 2/188 |
| | | | 310/339 |
| 2010/0270889 A1 | 10/2010 | Xu et al. | |
| 2011/0095654 A1* | 4/2011 | Steinkopff | H02N 2/18 |
| | | | 310/339 |
| 2011/0140578 A1* | 6/2011 | Ko | H01L 41/1138 |
| | | | 310/339 |
| 2011/0248605 A1* | 10/2011 | Lee | H02N 2/18 |
| | | | 310/339 |
| 2013/0088123 A1 | 4/2013 | Haskett | |
| 2013/0188341 A1 | 7/2013 | Tseng et al. | |
| 2013/0221802 A1* | 8/2013 | Oh | H02N 2/181 |
| | | | 310/319 |
| 2014/0077662 A1 | 3/2014 | Lueke et al. | |
| 2015/0180374 A1 | 6/2015 | Herder et al. | |
| 2016/0035964 A1 | 2/2016 | Storm et al. | |
| 2016/0233413 A1 | 8/2016 | Zawada et al. | |
| 2021/0044221 A1* | 2/2021 | Jia | H02N 2/186 |

OTHER PUBLICATIONS

Ghilini, Marie; International Search Report; PCT/GB2019/050265; 13 pages; dated Apr. 29, 2019.
Fellows, Jody; GB Search Report; GB 1801678.2; 5 pages; dated Aug. 1, 2018.

* cited by examiner

VIBRATIONAL ENERGY HARVESTER WITH PISTON DAMPING

CROSS REFERENCE TO RELATED APPLICATIONS

This application is a National Phase of PCT Patent Application No. PCT/GB2019/050265 having an International filing date of Jan. 30, 2019, which in turn claims priority to GB patent application 1801678.2, filed Feb. 1, 2018, the contents of both are hereby incorporated by reference in their entireties.

BACKGROUND

The invention relates to vibrational energy harvesters and in particular to vibrational energy harvesters in which excessive motion is damped.

Electrical vibrational energy harvesters operate by converting ambient vibrational energy into electrical energy. This energy can then be used to power local devices, such as wireless sensors. Various underlying transduction techniques can be used in vibrational energy harvesters, such as electrostatic transduction, electromagnetic transduction and piezoelectric transduction. In all cases it is the movement of a mass in the energy harvester as result of ambient vibrations that is converted into electrical energy.

One challenge for vibrational energy harvesters is that the ambient vibration that they experience is typically very variable and may be in several directions. An oscillator within a vibration energy harvester typically has transverse, lateral and torsional modes near the lower resonant frequency modes. But for vibrational energy harvesters with a transducer adapted to harness energy from transverse modes, the other modes either yield minimal energy recovery or adversely increase the wear and tear of the oscillatory system. The wear and tear can occur from twisting of the spring joints as well as collision with the stator or housing. Furthermore, the presence of undesirable lateral or torsional modes near frequency vicinity of the modes of operation, can negatively influence and distract the system from entering into the desired mode of operation.

It would be desirable to provide a vibrational energy harvester in which a moving mass is effectively constrained to move only in some modes of vibration without incurring significant energy losses.

Furthermore, in order to be most effective, vibrational energy harvesters need to be designed to operate efficiently at the levels of vibration that are expected the majority of the time. This means that from time to time they will experience levels of vibration that exceed the levels for which they have been designed. Excessive ambient vibration may lead to excessive displacement of the mass within the energy harvester. Excessive movement the mass can lead to mechanical damage to the energy harvester as a result of collisions and friction between moving parts and as a result of wear and tear on the materials of the energy harvester. Excessive movement of the mass can also lead to electrical problems if the voltage generated by the energy harvester exceeds the voltage for which the power conditioning circuitry has been designed.

It would therefore be desirable to provide an efficient and simple way to prevent excessive movement of a mass within a vibrational energy harvester.

SUMMARY

The invention is defined in the appended independent claims. Advantageous features are set out in the dependent claims.

In accordance with a first aspect of the invention, there is provided a vibrational energy harvester comprising:
a frame;
a flexure assembly coupled to the frame, the flexure assembly comprising a flexure configured to flex in a first direction relative to the frame and a mass fixed to the flexure, wherein when the mass is displaced in the first direction from a rest position, the flexure provides a restoring force on the mass to bring the mass back to the rest position; and
a transduction assembly configured to convert movement of the mass and flexure into electrical energy;
wherein the frame comprises a cavity positioned so that, if the mass is displaced in the first direction beyond a threshold distance, a portion of the flexure assembly extends into the cavity so that compression or restriction of fluid in the cavity applies an additional force on the flexure assembly.

The additional force may comprise a dissipative force, providing damping of the motion of the flexure assembly. The dissipative force may be the result of constricted fluid flow out of the cavity. The additional force may also, or instead, comprise an additional restoring force on the flexure assembly. The additional restoring force may be the result of elastic compression of the fluid within the cavity.

The invention provides an additional force that increases substantially once a threshold displacement is reached, which is when the portion of the flexure assembly extends into the cavity. The invention provides the additional force without any contact between frame and moving parts of the flexure assembly being required and without any additional electronic or magnetic components being required. Preferably the cavity is a blind cavity. In that case, increasing displacement of the portion of the flexure assembly into the cavity leads to an increasing additional force.

The additional force may be at least 25%, and more preferably at least 50% of the restoring force provided by the flexure. Advantageously, when the mass is displaced so that the portion of the flexure assembly occupies 50% of the volume of the cavity, the additional force is at least 25% of the restoring force provided by the flexure. Preferably, when the mass is displaced so that the portion of the flexure assembly occupies 50% of the volume of the cavity, the additional force is at least 50%, and preferably at least 100%, of the restoring force provided by the flexure. The additional force prevents collision of the flexure assembly with frame which might damage the energy harvester and prevents the generation of voltages greater than can be efficiently handled by electronic circuitry connected to the energy harvester.

Preferably the portion of the flexure assembly that extends into the cavity is shaped to match the dimensions of the cavity. The cavity may have an open end through which the portion of the flexure is received. The clearance between the portion of the flexure assembly and the cavity is ideally as small as possible while avoiding contact between the portion of the flexure assembly and the walls of the cavity and allowing for manufacturing tolerances. Preferably, the cross-sectional area of the portion of the flexure assembly in a plane parallel to the open end of the cavity is at least 70% of the cross-sectional area of the open end of the cavity. More preferably, the cross-sectional area of the portion of the flexure assembly in a plane parallel to the open end of the cavity is at least 80%, and even more preferably at least 95%, of the cross-sectional area of the open end of the cavity. Advantageously, the movement of the portion of the flexure assembly into the cavity results in squeeze film damping of the flexure or mass. The relationship between the additional force on the flexure assembly and the displacement of the flexure assembly is advantageously highly non-linear.

The cavity may be formed from rigid material such as silicon, metal or plastic. Beneficially, the sides of the cavity may be at least partially lined with a material that is deformed by contact with the mass, and preferably this deformation is permanent. Advantageously, this accommodates mechanical tolerances and allows the cavity to seal more closely around the mass than without such deformable material, increasing the elastic part of the restoring force.

The fluid may be air. This is simple and inexpensive. However, for some applications other fluids, such as helium, may be desirable. Different fluids provide different amounts of additional dissipative and restoring force. Similarly, the pressure of the fluid may be chosen to suit a particular application. Lower pressure provides for less damping of the flexure assembly at low displacements but can still provide significant damping at high displacements of the flexure assembly.

The portion of the flexure assembly that extends into the cavity may comprise all or a significant portion of the mass. Alternatively, the portion of the flexure assembly may comprise a projection that does not comprise a significant portion of the mass.

In preferred embodiments, the flexure assembly comprises two parallel flexures that are spaced from one another in the first direction and are coupled to each other at a position remote from the frame. Spaced in this context means separated by an air, or other fluid, gap, or by a vacuum gap. Coupling two parallel flexures in this way provides an axial restraint on the flexure assembly, and increases the resonant frequency of vibration modes that include off-axis motion, such as torsional modes of vibration, well above the resonant frequency of the desired modes of operation. This reduces off axis motion of the flexure assembly under typical operating conditions and so reduces friction and collision between the flexure assembly and the frame, in particular between the flexure assembly and walls of the cavity in the frame.

The spaced flexures may each have a thickness in the first direction, and a length and a width in the plane orthogonal to the first direction, where the width is the minimum dimension of the flexure in the plane orthogonal to the first direction. Advantageously, the flexures are spaced from one another in the first direction by a distance greater than 25% of the width of either of the flexures, and preferably by a distance of greater than 50% of the width of either of the flexures.

The spacing is advantageously such that the resonant frequency of any undesired torsional modes of vibration of the flexure assembly is at least 50% higher than the resonant frequency of those torsional modes of vibration for a flexure assembly comprising only one of the flexures.

The spaced flexures may be coupled to one another by the mass or by a portion of the transduction assembly. The spaced flexures may be coupled to one another at a position remote from the frame.

The spaced flexures may be substantially identical to one another. However, in some designs it may be advantageous for the spaced flexures to be different to one another. For example it may be advantageous to restrain the portion of the flexure that extends into the cavity as much as possible to travel in a first direction only. For example the spaced flexures may have a different length or stiffness to one another.

Each of the flexure or flexures may be a membrane flexure. Membrane flexures can provide a broad frequency band over which vibrational energy can be harvested efficiently and can provide well constrained axial motion. Alternatively, each of the flexures may be cantilever beams.

As used herein, the term membrane flexure means a flexure that is constrained or attached to a frame at more than one position, typically on opposite sides of the mass. A membrane flexure may be a clamped-clamped beam. A membrane flexure has a thickness much smaller than its length and width. Use of a membrane flexure will typically provide good axial constraint for the mass.

The membrane flexure may be substantially disc shaped. The membrane flexure may be circular or elliptical. Other shapes are also possible, such as rectangular or hexagonal. Where the flexure or flexures are membrane flexures, the mass may be fixed to a central portion of each of the membrane flexures and the frame fixed to a peripheral portion of each of the membrane flexures at two or more positions.

Alternatively, each of the flexure or flexures may be an inverted-membrane flexure, with the mass fixed to a peripheral portion of each of the flexures at two or more different positions and the frame fixed to a central portion of each of the flexures between the two or more different positions.

The cavity may comprise an annular channel configured to receive an annular portion of the flexure assembly. The cavity may comprise a cylindrical cavity configured to receive a corresponding cylindrical portion of the flexure assembly that acts as a piston in the cavity. A cylindrical cavity may have a round or rectangular or elliptical cross-section, for example. Preferably a cross-section of the cavity is the same shape as a cross-section of the portion of the flexure assembly that extends into the cavity.

The transduction assembly may comprise at least one piezoelectric element on the flexure assembly. Alternatively, or in addition, the transduction assembly may comprise a magnet and coil, with one of the magnet and coil being part of the flexure assembly. The other of the magnet and coil may be fixed to the frame.

The vibrational energy harvester may be a MEMS device. The frame and flexure may be integrally formed. The frame and flexure may be formed from silicon.

The vibrational energy harvester may comprise an electrical energy storage device for storing energy output by the transduction assembly. The vibrational energy harvester may comprise signal conditioning circuitry connected to the transduction assembly.

In a second aspect of the invention, there is provided a method of damping in a vibrational energy harvester, the vibrational energy harvester comprising: a frame, a flexure assembly coupled to the frame, the flexure assembly comprising a flexure configured to flex in an first direction relative to the frame and a mass fixed to the flexure, wherein when the mass is displaced in the first direction from a rest position, the flexure provides a restoring force on the mass to bring the mass back to the rest position, and a transduction assembly configured to convert movement of the mass and flexure into electrical energy, the method comprising:

providing an additional force on the mass when the mass has displaced more than a threshold distance from the rest position, the additional force resulting from compression of a gas or restriction of a fluid flow as the mass is displaced beyond the threshold distance.

In a third aspect of the invention, there is provided a vibrational energy harvester comprising:

a frame;

first and second membrane flexures, fixed to the frame, a mass, the mass being fixed to both the first and second membrane flexures;

wherein both the first and second membrane flexures are configured to flex to allow the mass to move in an first direction and both the first and second membrane flexures extend substantially orthogonal to the first direction, the first and second membrane flexures being parallel to one another, and separated from one another in the first direction; and a transduction assembly configured to convert movement of the mass and flexures into electrical energy.

The spaced membrane flexures may each have a thickness in the first direction, and a length and a width in the plane orthogonal to the first direction, where the width is the minimum dimension of the flexure in the plane orthogonal to the first direction. Advantageously, the flexures are spaced from one another in the first direction by a distance greater than 25% of the width of either of the flexures, and preferably by a distance of greater than 50% of the width of either of the flexures.

The provision of two parallel but spaced flexures provides for greater constraint of movement in directions non-parallel to the first direction than the use of single flexure of comparable stiffness to the two spaced flexures together. In particular, the onset of undesirable modes of vibration leading to off-axis movement of the flexures and mass can be substantially prevented during operation at expected frequencies of vibration close to the resonant frequency of the desired axial mode of vibration. Separated in this context means separated by an air, or other fluid, gap, or by a vacuum gap.

The spacing is advantageously such that the resonant frequency of any torsional modes of vibration of the flexure assembly is at least 50% higher than the resonant frequency of those torsional modes of vibration for the flexure assembly comprising only one of the flexures.

The first and second membrane flexures may each have a periphery fixed to the frame, and the mass may be fixed to a central portion of each of the first and second membrane flexures. In one embodiment, the membrane flexure is a clamped-clamped beam.

A membrane flexure has a thickness much smaller than its length and width. The membrane flexure may be substantially disc shaped and may be circular or elliptical. Other shapes are also possible, such as rectangular or hexagonal.

The first and second membrane flexures are advantageously in an unstrained configuration simultaneously. In other words, when one of the flexures is in an unstrained configuration, the other of the flexures is also in an unstrained configuration.

Advantageously, the first and second membrane flexures may be substantially identical to one another. However, the first and second membrane flexures may have different dimensions or material properties to one another.

The transduction assembly may comprise a piezoelectric transducer fixed to one of the first and second membrane flexures. The transduction assembly may comprise one or more piezoelectric transducers fixed to each of the first and second membrane flexures. The vibrational energy harvester may be a MEMS device. The frame and one or both of the flexures may be integrally formed.

Alternatively, the transduction assembly may comprise a coil and one or more magnets. The magnet or magnets may be fixed to the first and second membrane flexures. The coil may be fixed to the frame.

In a fourth aspect of the invention, there is provided a vibrational energy harvester comprising:

a frame;

first and second cantilever flexures, each having a fixed end fixed to the frame, a mass, the mass being fixed to a free end of both the first and second cantilever flexures;

wherein the first and second cantilever flexures are configured to flex to allow the mass to move in a first direction and extend substantially orthogonal to the first direction, the first and second cantilever flexures being parallel to one another, and separated from one another in the first direction; and a transduction assembly configured to convert movement of the mass and flexures into electrical energy.

Separated in this context means separated by an air, or other fluid, gap, or by a vacuum gap.

The transduction assembly may comprise one or more magnets and a coil. The mass may comprise the one or more magnets. The coil may be fixed relative to the frame.

In one embodiment, the mass comprises first and second magnets arranged on opposite sides of the coil in a direction orthogonal to a plane of movement of the mass. The one or more magnets may have a greater extent in the first direction than the coil.

The cantilever flexures may each have a length extending from the fixed to the free end, in a direction orthogonal to the first direction, and a thickness extending in the first direction, and a width extending in a direction orthogonal to the length and to the thickness, wherein the length is greater than the width, and the width is greater than the thickness.

The first and second cantilever flexures are advantageously in an unstrained configuration simultaneously. In other words, when one of the flexures is in an unstrained configuration, the other of the flexures is also in an unstrained configuration.

Advantageously, the first and second cantilever flexures are substantially identical to one another. However, the first and second cantilever flexures may have different dimensions or material properties to one another.

Advantageously, the flexures are spaced from one another in the first direction by a distance greater than 25% of the width of either of the flexures, and preferably by a distance of greater than 50% of the width of either of the flexures. The spacing is advantageously such that the resonant frequency of any torsional modes of vibration of the flexure assembly is at least 50% higher than the resonant frequency of those torsional modes of vibration for the a flexure assembly comprising only one of the flexures.

The vibrational energy harvester may be a MEMS device. The transduction assembly may comprise piezoelectric elements on one or both of the flexures. The frame and one or both of the flexures may be integrally formed.

The first and second cantilever flexures arranged in this way give rise to a curved locus of displacement of the mass during vibration of the flexures. Advantageously, part of the cavity or mass may be shaped to accommodate such curved motion.

In a fifth aspect of the invention, there is provided a vibrational energy harvester comprising:
a frame;
a mass;
first and second inverted-membrane flexures, wherein the mass is fixed to a peripheral portion of each of the inverted-membrane flexures at two or more different positions and the frame fixed to a central portion of each of the inverted-membrane flexures between the two or more different positions,
wherein the first and second inverted-membrane flexures are configured to flex to allow the mass to move in a first direction, and both the first and second inverted- membrane flexures extend substantially orthogonal to the first direction, the first and second inverted-membrane flexures being parallel to one another, and separated from one another in the first direction; and
a transduction assembly configured to convert movement of the mass and inverted-membrane flexures into electrical energy.

Separated in this context means separated by an air, or other fluid, gap, or by a vacuum gap.

The transduction assembly may comprise one or more magnets and a coil. The mass may comprise the one or more magnets. The coil may be fixed relative to the frame.

In one embodiment, the mass comprises first and second magnets arranged on opposite sides of the coil in a direction orthogonal to a plane of movement of the mass. The one or more magnets may have a greater extent in the first direction than the coil.

The first and second inverted-membrane flexures are advantageously in an unstrained configuration simultaneously. In other words, when one of the flexures is in an unstrained configuration, the other of the flexures is also in an unstrained configuration.

The flexures may each have a thickness extending in the first direction, and a length and a width extending in directions orthogonal to the first direction, wherein the length and the width of each flexure is greater than the thickness.

Advantageously, the flexures are spaced from one another in the first direction by a distance greater than 25% of the width of either of the flexures, and preferably by a distance of greater than 50% of the width of either of the flexures. The spacing is advantageously such that the resonant frequency of any torsional modes of vibration of the flexure assembly is at least 50% higher than the resonant frequency of those torsional modes of vibration for the flexure assembly comprising only one of the flexures.

Advantageously, the first and second inverted-membrane flexures are substantially identical to one another. However, the first and second flexures may have different dimensions or material properties to one another.

The vibrational energy harvester may be a MEMS device. The transduction assembly may comprise piezoelectric elements on one or both of the flexures. The frame and one or both of the flexures may be integrally formed.

The first and second inverted membrane flexures may be arranged to provide substantially linear motion of the proof mass along an axis in normal operation.

A key issue with vibrational energy harvester designs is fatigue or elastic failure of the flexures due to excessive travel or displacement, as this induces cyclic stresses in the flexures.

Typically, devices have been tuned for a particular frequency or frequencies by adjusting the thickness, size or shape of the flexure, and the magnitude of the proof mass.

Most applications of vibrational energy harvesters are size constrained, and this defines the maximum extent of each flexure. So, while it is possible to increase the maximum displacement at the fatigue limit by increasing length, this can make the device too large. Power output is known to increase with the mass, and it is therefore not desirable to reduce the mass to avoid excessive fatigue.

Designers of vibration energy harvesters have therefore historically selected flexure thickness and masses to achieve the desired tuning. For example, to increase the operating frequency, thicker flexures are used. But as a result, especially for devices that are intended to operate at acceleration levels in excess of 0.1 g, there is a limit to the maximum acceleration that the device can sustain and the achievable output power.

While the methods for limiting the maximum travel of the spring described in the preceding aspects of the invention can be used to limit stress in the spring, it is desirable to increase the maximum travel beyond what is possible with the single or double flexure configurations described previously.

A further problem is that is in small vibrational energy harvesters, maximum travel of the mass can be small and therefore difficult to limit within mechanical design tolerances, even using damping arrangements described in relation to the first aspect of the invention.

For example, consider a dual cantilever vibration energy harvesting device as described above. With a pair of flexures of 0.20 mm beryllium copper, with 25 mm operating length and 30 mm width, the maximum travel to achieve a surface von Mises stress within a factor of safety below the fatigue limit is 1 mm from the resting point. A displacement of 1 mm can just be accommodated with stopping mechanisms as described above and in the art, though it is small and difficult to work with. With a 250 gram proof mass, the device would have a primary resonant frequency of 20 Hz. With a representative level of electrical damping to optimise harvested energy, the sinusoidal input acceleration at the resonant frequency that results in the maximum travel is 0.25*g. This maximum acceleration is quite low, and a higher operating acceleration level would greatly increase achievable output power and widen the number of applications that the device can survive.

Now consider modifying this device to operate at 65 Hz centre frequency, which is required for a different application. The frequency of operation may be increased by increasing flexure thickness to 0.50 mm. However, the maximum travel within the same safety margin is now 0.5 mm and, with the same damping apparatus, this occurs at acceleration of 0.5*g. This reduced travel means that it is now difficult to manufacture the device with an acceptable tolerance, as manufacturing variations can be on the order of 0.1 mm. If the device is tuned to higher frequencies, the maximum travel becomes smaller still.

The example 65 Hz device noted above is able to output approximately 50 mW at the maximum input acceleration of 0.5*g. In applications with higher levels of acceleration, the damping means used to limit device travel mean that it is not possible to extract the full amount of energy available. However, if the device could be modified to operate normally at higher acceleration levels and flexure travel, power output would be higher. For example, if it could work at 1*g, the maximum output power would be approximately 4 times greater—or 200 mW.

A further problem relates to manufacturing. Customer applications have different vibration profiles with different dominant frequencies. However, it is uneconomic for a manufacturer to obtain and stock very large numbers of different spring thicknesses to accommodate the range of operating frequencies that may be required, which for the example devices noted above might range from 15 Hz to 200 Hz.

To address these problems, in any of the preceding aspects of the invention, any one of the flexures may comprise two or more layered flexure elements, with each flexure element in a flexure parallel to each other but spaced from each other in the first direction. Each flexure element may comprise a sheet of spring material. Each flexure element may be spaced from an adjacent flexure element by one or more shims or spacers. The shims or spacers may have a thickness of the same order of magnitude as the flexure elements. Each of the shims or spacers may have the same thickness as each of the flexure elements. The shims of spacers may be formed from the same material or materials as the flexure elements. Each flexure element may be substantially identical. The spacing distance between flexure elements in the thickness direction is advantageously less than 25% of the width of any of the flexure elements. The shims or spacers provide an air, or other fluid) gap between the flexure elements.

Advantageously, the thickness of such shims or spacers is designed such that in normal displacement of the mass, the deformation of the spaced flexure elements does not lead to a flexure element making contact with another flexure element or with the mass. This has the benefit of minimising wear of the surface of the flexure elements.

In any of the preceding aspects of the invention, any one of the flexures may be may be bistable. In other words, the flexure may have two stable equilibria separated by an unstable equilibrium position. A flexure may be made bistable by pre-stressing it, for example. One or more bistable flexures may be beneficial in some environments, depending on the amplitude and frequency band of the vibrations in the environment.

In a further aspect of the invention there is provided a vibrational energy harvester comprising:
a frame;
a mass connected to the frame by at least one flexure, the flexure configured to flex in a first direction, wherein the at least one flexure comprises a plurality of parallel flexure elements, spaced apart in the first direction.

Each flexure element may comprise a sheet of spring material. Each flexure element may be spaced from an adjacent flexure element by one or more shims or spacers. The shims or spacers may have a thickness of the same order of magnitude as the flexure elements. Each of the shims or spacers may have the same thickness as each of the flexure elements. The shims of spacers may be formed from the same material or materials as the flexure elements. Each flexure element may be substantially identical. The spacing distance between flexure elements in the thickness direction is advantageously less than 25% of the width of any of the flexure elements, wherein the width is the minimum dimension of a flexure element in a plane orthogonal to the first direction.

To increase the frequency of a vibrational energy harvester, rather than increasing thickness of a single monolithic flexure, a layered assembly of springs or flexure elements may be used to form a flexure. In order to avoid wear, the flexure elements may be separated with spacers, such as thin sheets of the spring material. The spacers provide an air, or other fluid) gap between the flexure elements.

Layering flexure elements can be used to increase the spring constant of one or more flexures in a vibrational energy harvester. For example, to increase the spring constant of a dual flexure assembly by 50%, three flexure elements can be used instead of two. One of the flexures can be formed by using two flexure element and the other flexure can be formed from a single flexure element. To double the spring constant, four flexure elements would be used, typically two in each flexure. By combining flexures of slightly different thicknesses, for example 0.20 mm and 0.25 mm, it is possible to make even finer changes to the spring constant and hence the frequency, without needing to stock flexures of different shape or adjust flexure length.

Beneficially, this allows the maximum displacement of a flexure assembly to be increased compared to a single or paired flexure assembly having the same spring constant but formed using non-layered flexures. In the example above, using an assembly of 0.20 mm flexures for the 65 Hz device would give a maximum displacement of 1 mm and a maximum operating acceleration of 1*g, provided that other clearances are set to accommodate the motion of the proof mass.

Thus this approach increases the maximum available power, allows increased manufacturing tolerances, permits fine tuning of frequency over a wide range requiring the stock of only a small number of different flexure thicknesses, and increases the tolerance of a device to high vibration.

For the avoidance of doubt, features described in relation to one aspect of the invention may be applied to other aspects of the invention.

DRAWINGS

Embodiments of the invention will now be described, by way of example only, with reference to the drawings, in which:

FIG. 2b is a plan view of the base of the frame of the embodiment of FIG. 2a;

FIG. 5b is a perspective view of FIG. 5a; and

DESCRIPTION

Figure 1:
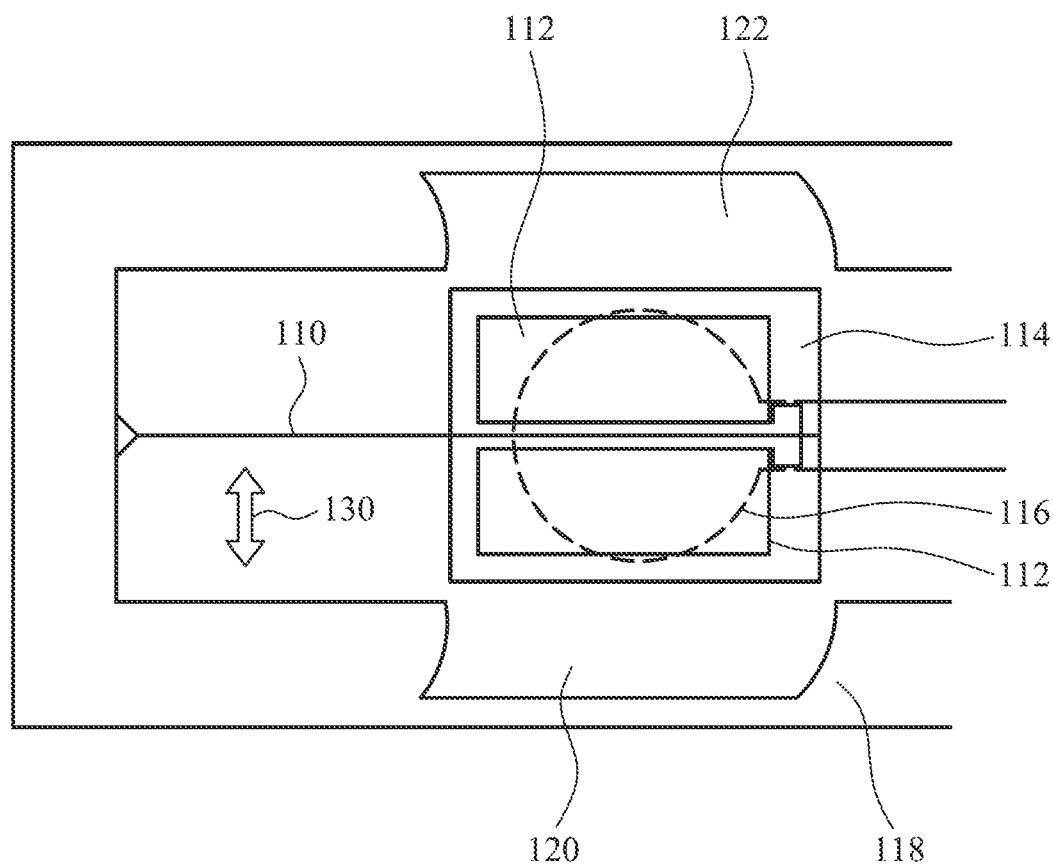
FIG. 1 is a schematic illustration of a first embodiment in accordance with a first aspect of the invention.

FIG. 1 is a side view of a vibrational energy harvester in accordance with a first embodiment of the invention. The energy harvester comprises a mass 114, including permanent magnets 112, coupled to a frame 118 by a flexure 110, and a coil 116 (illustrated in dotted line) fixed relative to the frame and positioned adjacent to the magnets. A pair of magnets may be arranged on each side of the coil with their poles in an opposed relationship to provide a well contained magnetic field across the coil. The magnets move on the flexure as a result of ambient vibration. The magnets and coil together form a transducer assembly. Motion of the magnets on the flexure assembly provides a varying magnetic flux across the coil, inducing an electrical current in the coil. The electrical current can be used to charge an electrical energy store or to power one or more electrical devices.

The flexure is a cantilever beam configured to flex to allow the mass to move in an first direction, as indicated by arrow 130. The flexure is formed from a sheet of spring steel. When the vibrational energy harvester undergoes vibration in the first direction, the mass moves in the first direction, directly driving the flexure. The flexure includes an aperture (not visible in FIG. 1), to allow the coil 116 to pass through the flexure without interference. With this arrangement, magnets can be positioned on both sides of the coil. Movement of the magnets past the coil as a result of ambient vibration induces a current in the coil. The induced current is the output of the energy harvester.

It can be seen that the frame of the embodiment shown in FIG. 1 includes a pair of cavities 120, 122 on opposite sides of the mass 114 in the direction of travel of the mass. If the mass oscillates in use with a sufficient amplitude, a portion of the mass will be received in each cavity during each cycle of oscillation. The cavities are dimensioned, at least in the plane orthogonal to the first direction, to be only slightly larger than the mass so that the portion of the mass extending into each cavity acts like a piston, compressing the air in the cavity and restricting air flow out of the cavity.

The effect of the frame structure shown in FIG. 1 is to provide an additional force on the mass, which adds to the restoring force provided by the flexure. The piston effect of a portion of the mass (or other element fixed to the flexure) in effect increases the stiffness of the flexure when the portion of the mass enters the cavity. This prevents excessive displacement of the mass and so reduces the chance of collisions between the frame 118 and the moving parts of the energy harvester and also limits the induced current.

The additional force is due to compression of the gas in the cavity, which in this example is air, and/or constriction of the flow of fluid from the cavity. Squeeze film effects can also be significant, particularly in MEMS structures. The portion of the flexure assembly that extends into each cavity, and the cavity, can be shaped to provide the required damping. For example grooves or apertures may be included in the portion of the flexure assembly, or in the walls of the cavity to tune the damping effect.

In the embodiment illustrated in FIG. 1, cavities are provided both above and below the mass. However, it is possible to provide the piston damping on only one side, by providing only a single cavity. This will reduce the damping by a factor of 2.

Figure 2A:
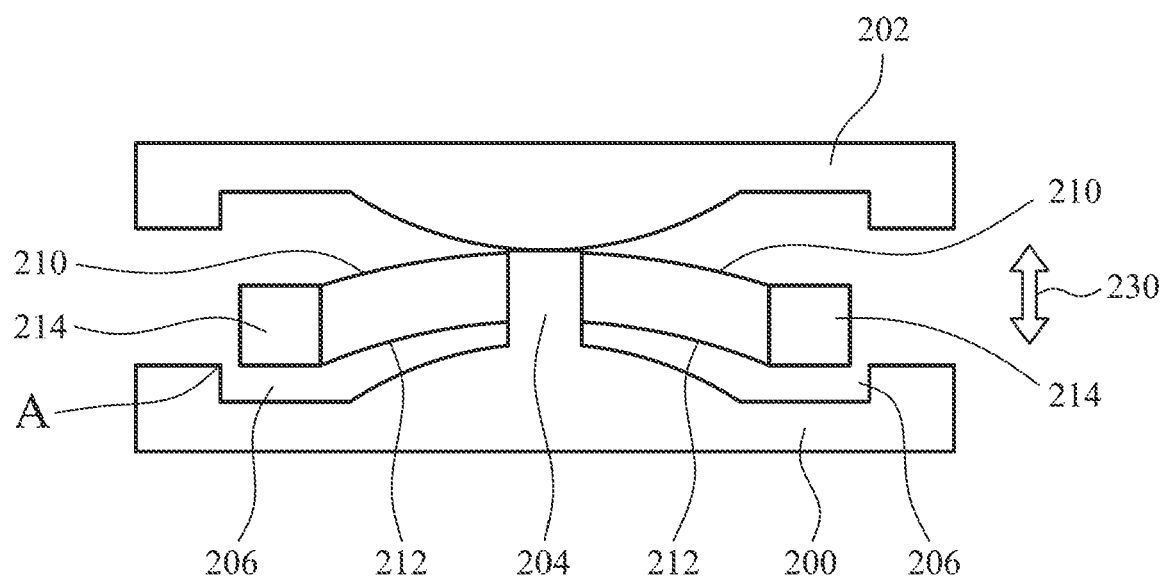
FIG. 2a is a schematic illustration of a second embodiment in accordance with a first aspect of the invention.
Figure 2B:
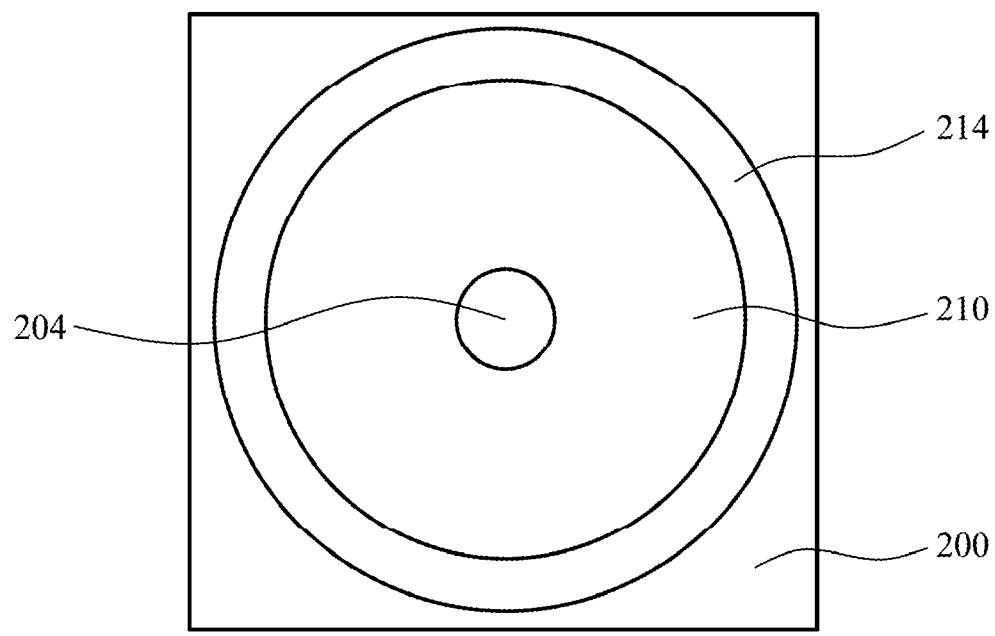

FIGS. 2*a* and 2*b* illustrate a second embodiment of the invention that provides for piston damping. The embodiment of FIG. 2*a* is a MEMS vibrational energy harvester. The frame of the energy harvester comprises a base 200 and a lid 202 formed from silicon. The base includes a central anchor 204 from which two parallel, identical membranes 210, 212 extend. The membranes are also formed from silicon. The two parallel membranes are fixed together in an axially spaced arrangement by an annular mass 214. FIG. 2*b* is a plan view of the base 200 and membranes, illustrating the annular shape of mass 214.

The energy harvester includes a piezoelectric layer on each of the membranes. If the energy harvester is subjected to vibrations in an first direction, indicated by arrow 230, the mass moves in the first direction, causing the membranes to flex and apply a restoring force on the mass. The piezoelectric layers are strained as the membranes flex, and so output a current, which is the output of the energy harvester.

The base 200 and the cap 202 each define an approximately annular cavity 206 into which the mass and flexures extend if the amplitude of vibration of the mass exceeds a threshold, providing a damping force and additional restoring force on the mass in the same manner as the embodiment of FIG. 1. As shown in FIG. 2*a*, when the mass moves downward past point A, air trapped underneath the membrane 212 and the mass 214 is compressed providing an additional force on the mass. The further the mass is displaced into the cavity the greater the additional force applied by the air. The cavity is designed so that when the mass is displaced half way into the cavity, the air provides at least 50% of the restoring force that is provided by the flexures.

In the embodiment shown in FIG. 2, two parallel, spaced membrane flexures are provided because this arrangement provides for better axial constraint of the mass than when a single membrane flexure is used. The resonant frequency of torsional and asymmetric bending modes of the membranes are significantly increased using two spaced membranes, so that they will not be excited during normal operating conditions. This reduces the likelihood of collisions between the frame and the moving parts of the energy harvester. This is particularly critical in the embodiment of FIG. 2, because for reliable piston damping the mass should move only in the first direction.

Figure 3:
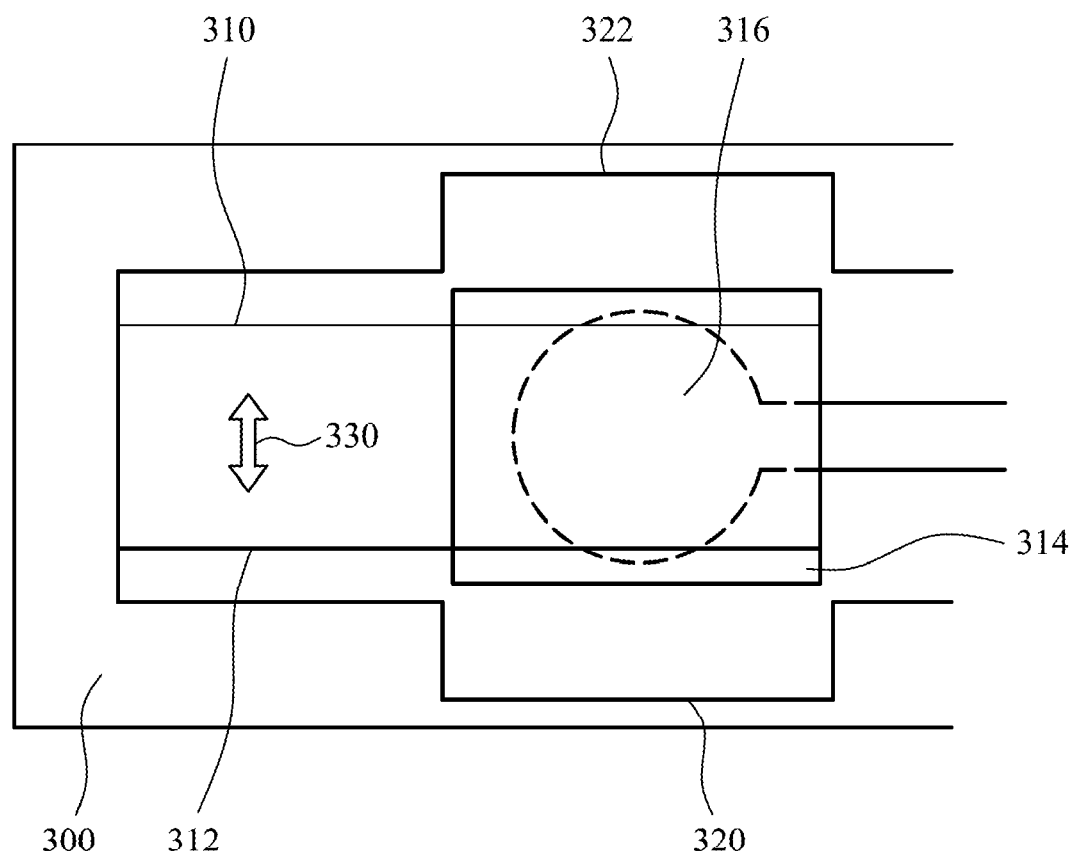
FIG. 3 is a schematic illustration of a third embodiment in accordance with a first aspect of the invention.

FIG. 3 is a schematic illustration of an energy harvester in accordance with a third embodiment of the invention. The embodiment of FIG. 3 is the same as the embodiment of FIG. 1 except that two parallel cantilever flexures 320, 322 are included in place of a single cantilever flexure in order to provide for better axial restraint of the moving mass.

The two cantilever flexures are both fixed at one end to the frame 310. At their free ends, the cantilever flexures 320, 322 are rigidly coupled together by a mass 314. The cantilever flexures may be formed from a suitable resilient material, such as spring steel. As in the embodiment of FIG. 1, the mass includes a plurality of permanent magnets. A coil 316 (illustrated in dotted line) is fixed relative to the frame 300 adjacent to the magnets. A pair of magnets may be arranged on each side of the coil with their poles in an opposed relationship to provide a well contained magnetic field across the coil. The magnets and coil together form a transducer assembly. Motion of the magnets on the flexure assembly provides a varying magnetic flux across the coil, inducing an electrical current in the coil. The electrical current can be used to charge an electrical energy store or to power one or more electrical devices.

When the vibrational energy harvester undergoes vibration in the first direction, the mass moves in the first direction, directly driving the flexure. The flexure includes an aperture (not visible in FIG. 3 but illustrated in FIG. 6*b*), to allow the coil 116 to pass through the flexure without interference. With this arrangement, magnets can be positioned on both sides of the coil.

It can be seen that the frame of the embodiment shown in FIG. 1 includes a pair of cavities 320, 322 on opposite sides of the mass 314 in the direction of travel of the mass, in the same manner as the embodiment of FIG. 1. If the mass oscillates in use with a sufficient amplitude, a portion of the mass will be received in each cavity during each cycle of oscillation. The cavities are dimensioned, at least in the plane orthogonal to the first direction, to be only slightly larger than the mass so that the portion of the mass extending into each cavity acts like a piston, compressing the air in the cavity and restricting air flow out of the cavity.

The effect of the frame structure shown in FIG. 3 is to provide an additional force on the mass, in the same manner as the embodiments of FIGS. 1 and 2.

Instead of one or two parallel cantilever flexures, it is possible to use clamped-clamped beams. An example of a clamped-clamped beam arrangement is described with reference to FIGS. 7a and 7b.

Figure 4:
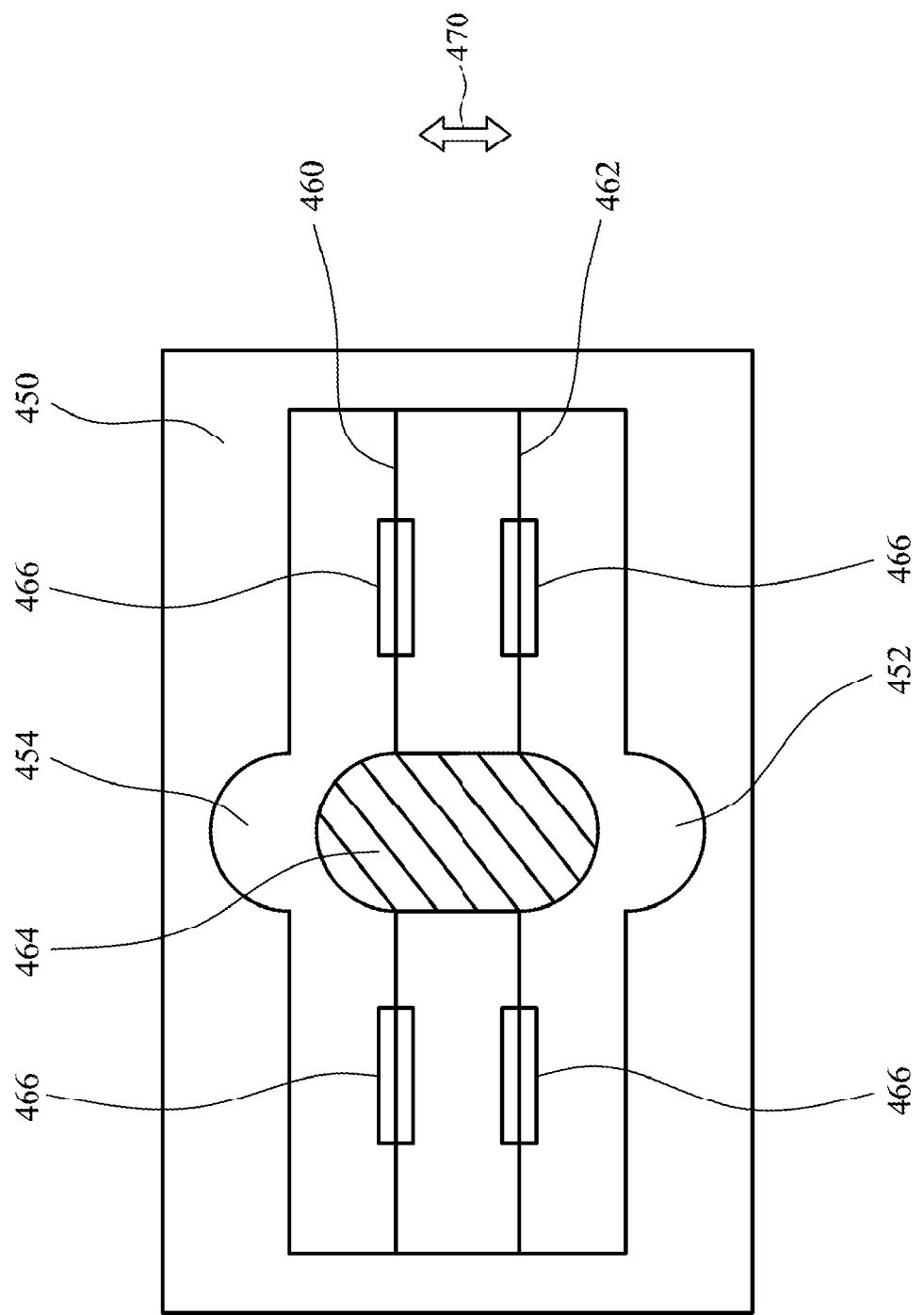
FIG. 4 is a schematic illustration of a fourth embodiment in accordance with a first aspect of the invention.

FIG. 4 is a schematic illustration of an energy harvester in accordance with a fourth embodiment of the invention. The energy harvester shown in Figure is similar to that shown in FIG. 2a in that it comprises two parallel membrane flexures 460, 462. However, instead of having a central anchor fixing the membranes to the frame and a peripheral mass, the embodiment of FIG. 4 has the membrane flexures attached to a frame 450 at their periphery and attached to a central mass 464 at a central portion of both membrane flexures.

The embodiment of FIG. 4 is a MEMS vibrational energy harvester. The frame of the energy harvester 450 encases two parallel, identical circular membranes 460,462. The two parallel membranes are fixed together in a spaced arrangement. A central mass 464 is fixed to the centre of both flexures and extends above and below the flexures.

The energy harvester includes a piezoelectric layer 466 on each of the membranes 460, 462. If the energy harvester is subjected to vibrations in a first direction, indicated by arrow 470, the mass moves in the first direction, causing the membranes to flex and apply a restoring force on the mass. The piezoelectric layers are strained as the membranes flex, and so output a current, which is the output of the energy harvester.

The frame defines a top cavity 454 and a bottom cavity 452 into which the mass 464 extends if the amplitude of vibration of the mass exceeds a threshold. Compression of air within the cavity provides a damping force and an additional restoring force on the mass in the same manner as the embodiment of FIG. 1. The further the mass is displaced into a cavity the greater the additional force applied by the air.

In the embodiment shown in FIG. 4, as in the embodiment of FIG. 2, two parallel, spaced membrane flexures are provided because this arrangement provides for better axial constraint of the mass than when a single membrane flexure is used.

It is of course possible to implement a vibrational energy harvester without the piston damping described in relation to FIGS. 1 to 4. For example, the double membrane structures of FIGS. 2 and 4 could be implemented without the formation of cavities in a frame above and below the flexures. Similarly, the double cantilever structure of FIG. 3 can be made without portions of the frame above and below the flexure assembly providing damping cavities. The arrangement of two spaced, parallel flexures rigidly connected to a common mass has significant benefits in providing axial constraint. This substantially prevents the activation of undesirable modes of vibration under normal operating conditions, which might give rise to wear between parts of the energy harvester and might fatigue the flexures. It also increases the likelihood of the desired axial mode of vibration being entered. In particular by providing two flexures that are spaced in a first direction by a distance equal to at least 25% of the width of either of the flexures, the resonant frequency of torsional modes involving motion non-parallel to the first direction can be significantly increased to the point where they lie outside the band of expected input vibration frequencies.

Figure 5A:
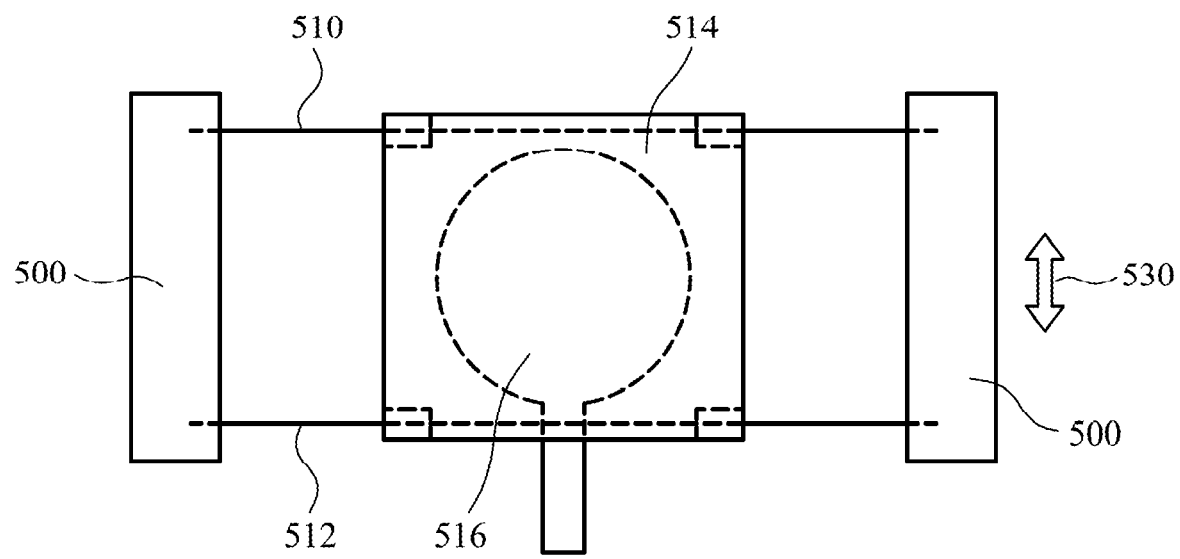
FIG. 5a is a schematic illustration of a fifth embodiment, in accordance with a third aspect of the invention.
Figure 5B:
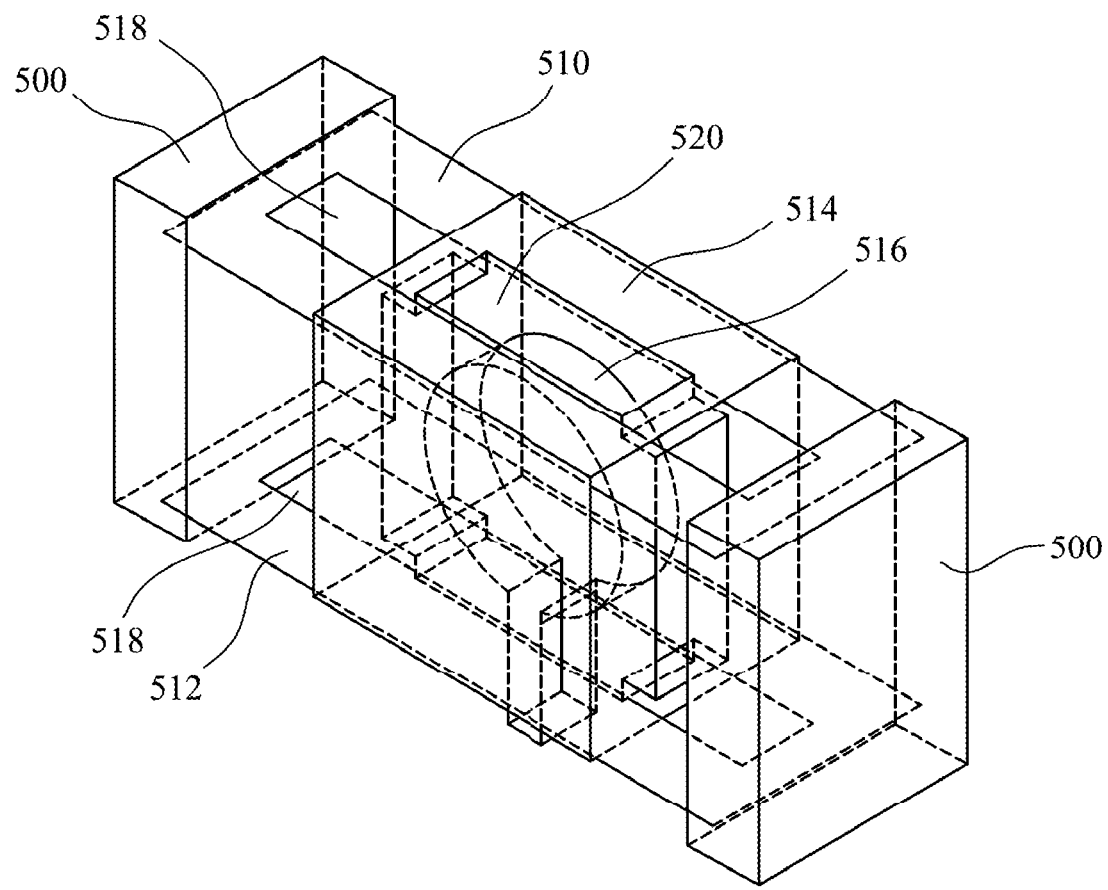

FIG. 5a is a schematic illustration of a fifth embodiment of the invention, illustrating an alternative topology and without any piston damping arrangement shown. FIG. 5b is a perspective view of the embodiment of FIG. 5a, with the components shown transparent for ease of understanding.

The embodiment of FIG. 5a is similar to the embodiment of FIG. 3, but instead of two parallel cantilever flexures, two clamped-clamped beams are used.

FIG. 5a shows two elongate flexures 510, 512 fixed at either end to a frame 500. The two flexures are clamped-clamped beams because they are fixed at both ends. The two flexures 510, 512 are identical and spaced apart in an first direction, indicated by arrow 530. A mass assembly 514 is rigidly fixed to a central portion of both flexures. The mass assembly include permanent magnets (not shown) held within a casing. As can be seen in FIG. 5s, both flexures include a longitudinally extending central slot 518. The mass assembly also includes a central slot 520. A coil 516, which is fixed relative to the frame is positioned within the slots 518, 520.

When the energy harvester undergoes vibration in the first direction, the mass assembly displaces in the first direction, causing the flexures to flex and provide a restoring force on the mass to bring it back to a central position in which the flexures are unstressed. Movement of the magnets within the mass assembly provides a changing magnetic flux across the coil, inducing a current in the coil. The induced current is the output of the energy harvester, as in the previously described embodiments.

The provision of two parallel but spaced flexures ensures good axial constraint of the flexures, preventing the onset of undesirable torsional modes of vibration and increasing the likelihood that the flexures will vibrate in the desired mode of vibration.

Figure 6:
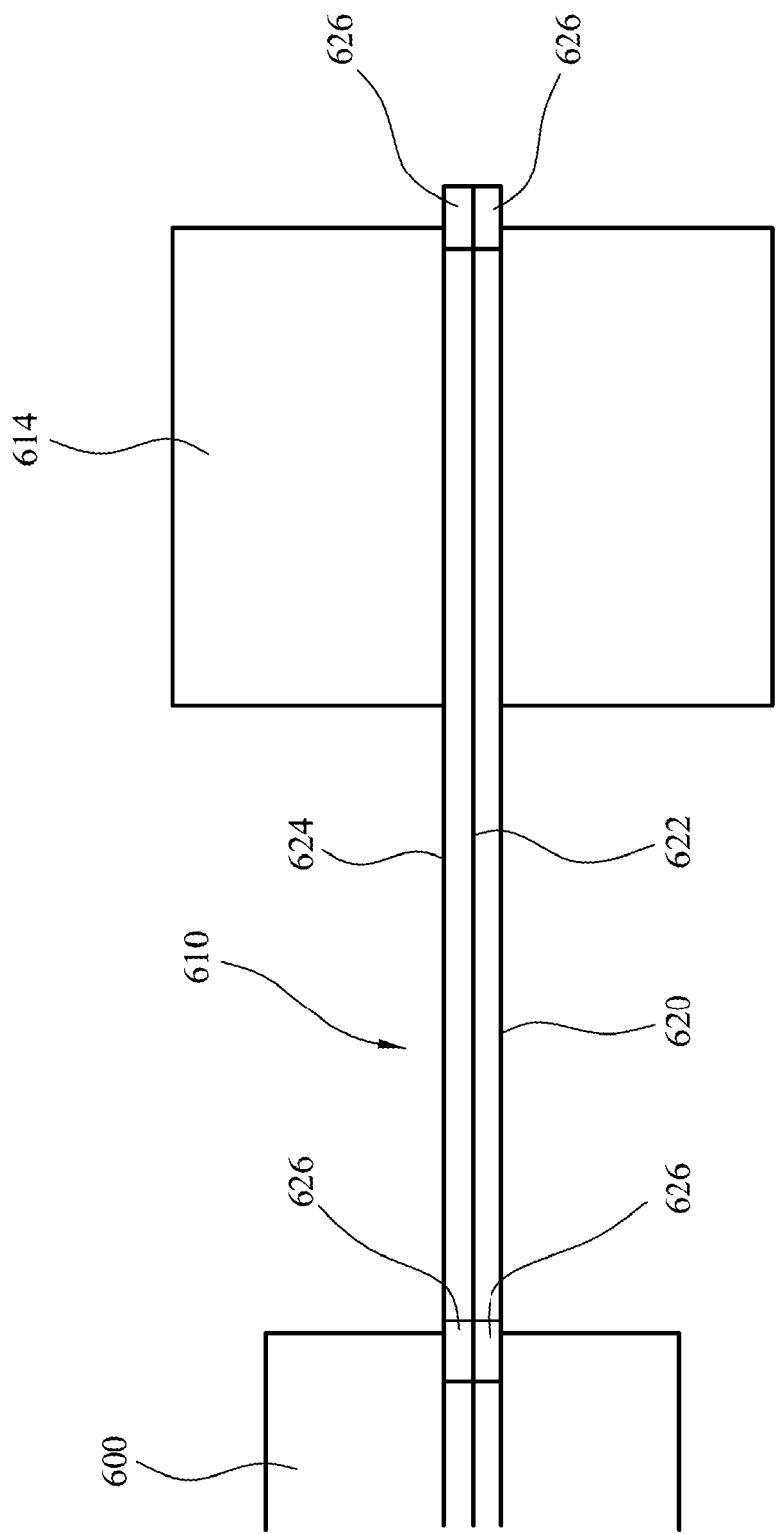
FIG. 6 is a schematic illustration of a layered flexure assembly.

In each of the described embodiments, the flexures have been described as one-piece structures formed from a resilient material such as spring steel. However, it may be advantageous to use flexures made from two or more flexure elements arranged in a layered structure. FIG. 6 is a schematic illustration of a layered flexure. FIG. 6 shows a flexure 610 connected between a frame 600 and a mass 614. The flexure 610 comprises three flexure elements, 620, 622, 624 arranged in a stack. The flexure elements 620, 622, 624 are identical to each other and formed from spring steel. They are spaced from each other by spacers 626, also formed from spring steel and have the same thickness as the flexure elements. A layered flexure constructed in this manner can allow for greater maximum displacement of the flexure without exceeding fatigue limits, and so allows for greater energy harvesting capability.

Although the invention has been described with reference to a few specific embodiments, it should be clear that variations from these embodiments are possible and that the drawings are schematic. For example, the portion of the flexure assembly extending into a cavity to provide for piston type damping may be shaped to provide for greater tolerance between the moving parts. The flexures may be provided with different shapes and aspect ratios, and different transduction arrangements may be used, such as electrostatic transduction.

The invention claimed is:

1. A vibrational energy harvester comprising:
   a frame;
   a flexure assembly coupled to the frame, the flexure assembly comprising a flexure configured to flex in an first direction relative to the frame and a mass fixed to the flexure, wherein when the mass is displaced in the first direction from a rest position, the flexure provides a restoring force on the mass to bring the mass back to the rest position; and
   a transduction assembly configured to convert movement of the mass and flexure into electrical energy;

wherein the frame comprises a cavity positioned so that, if the mass is displaced in the first direction beyond a threshold distance, a portion of the flexure assembly extends into the cavity so that compression or restriction of fluid in the cavity applies an additional force on the flexure assembly.

2. A vibrational energy harvester according to claim 1, wherein when the mass is displaced so that the portion of the flexure assembly occupies 50% of the volume of the cavity, the additional force is at least 25% of the restoring force provided by the flexure.

3. A vibrational energy harvester according to claim 2, wherein when the mass is displaced so that the portion of the flexure assembly occupies 50% of the volume of the cavity, the additional force is at least 50%, and preferably at least 100%, of the restoring force provided by the flexure.

4. A vibrational energy harvester according to claim 1, wherein the fluid is air.

5. A vibrational energy harvester according to claim 1, wherein the movement of the portion of the flexure assembly into the cavity results in squeeze film damping.

6. A vibrational energy harvester according to claim 1, wherein the portion of the flexure assembly comprises the mass.

7. A vibrational energy harvester according to claim 1, wherein the flexure assembly comprises two flexures spaced from one another in the first direction and that are coupled to each other at a position remote from the frame.

8. A vibrational energy harvester according to claim 7, wherein the spaced flexures are coupled to one another by the mass.

9. A vibrational energy harvester according to claim 1, wherein each of the flexure or flexures is a membrane flexure.

10. A vibrational energy harvester according to claim 9, wherein the mass is fixed to a central portion of each of the membrane flexures and the frame is fixed to a peripheral portion of each of the membrane flexures.

11. A vibrational energy harvester according to claim 1, wherein each of the flexure or flexures is an inverted-membrane flexure, wherein the mass is fixed to a peripheral portion of each of the membrane flexures at two or more positions and the frame is fixed to a central portion of each of the membrane flexures.

12. A vibrational energy harvester according to claim 1, wherein the cavity comprises an annular channel or a cylindrical cavity.

13. A vibrational energy harvester according to claim 1, wherein the transducer assembly comprises at least one piezoelectric element on the flexure assembly.

14. A vibrational energy harvester according to claim 1, wherein the vibrational energy harvester is a MEMS device.

* * * * *